US006822374B1

(12) United States Patent
Smith et al.

(10) Patent No.: US 6,822,374 B1
(45) Date of Patent: Nov. 23, 2004

(54) MULTILAYER PIEZOELECTRIC STRUCTURE WITH UNIFORM ELECTRIC FIELD

(75) Inventors: Lowell Scott Smith, Niskayuna, NY (US); Douglas Glenn Wildes, Ballston Lake, NY (US); Venkat Subramaniam Venkataramani, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 203 days.

(21) Appl. No.: 09/712,687

(22) Filed: Nov. 15, 2000

(51) Int. Cl.[7] .......... H01L 41/08
(52) U.S. Cl. .......... 310/334
(58) Field of Search .......... 310/339, 334, 310/336, 322; 367/140

(56) References Cited

U.S. PATENT DOCUMENTS

| | | | | |
|---|---|---|---|---|
| 4,217,684 A | | 8/1980 | Brisken et al. | 29/25.35 |
| 4,460,841 A | * | 7/1984 | Smith et al. | 310/334 |
| 5,163,436 A | * | 11/1992 | Saitoh et al. | 310/335 |
| 5,329,496 A | | 7/1994 | Smith | 367/140 |
| 5,381,067 A | * | 1/1995 | Greenstein | 310/334 |
| 5,381,385 A | * | 1/1995 | Greenstein | 367/140 |

OTHER PUBLICATIONS

Goldberg et al., "Multi–Layer PZT Transducer Arrays for Improved Sensitivity", 1992 IEEE Ultrasonics Symposium, pp. 551–554.

Saitoh et al., "A Low–Impedance Ultrasonic Probe Using a Multilayer Piezoelectric Ceramic," Jap. Jour. Appl. Phys., vol. 28, Supp. 28–1, pp. 54–56 (1989).

Desilets et al., "Effect of Wraparound Electrodes on Ultrasonic Array Performance," 1998 IEEE Ultrasonics Symposium (preprint).

Martin et al., "Back–Face Only Electrical Connections of Thickness Mode Piezoelectric Transducers," IEEE Trans, UFFC, vol. 33, No. 6, 778–781 (1986).

* cited by examiner

*Primary Examiner*—Thomas D. Dougherty
*Assistant Examiner*—Karen Addison
(74) *Attorney, Agent, or Firm*—Fletcher Yoder

(57) ABSTRACT

An ultrasound transducer element incorporates material of low dielectric constant to confine the electric field of a stack of piezoelectric ceramic layers. Edge segments made of material having a low dielectric constant and extending in the thickness direction are formed at opposing ends of the multilayer structure. These regions of low dielectric constant material confine the electric field to the piezoelectric ceramic material of high dielectric constant, where it remains directed vertically. In this way, when a voltage is applied between the electrodes, the piezoelectrically induced strains are almost entirely vertical. Spurious modes are therefore substantially reduced.

13 Claims, 5 Drawing Sheets

MULTILAYER PIEZOELECTRIC STRUCTURE WITH UNIFORM ELECTRIC FIELD

The U.S. government has certain rights in this invention pursuant to Contract No. N00014-96-C-0189 awarded by the Department of the Navy.

BACKGROUND OF THE INVENTION

Ultrasound transducers used for medical imaging and non-destructive testing are characterized by two main properties, sensitivity and bandwidth, which are directly correlated to the penetration and resolution of the imaging system. It is well known in the art that multilayer piezoelectric structures provide sensitivity enhancement compared to conventional single-layer devices because the multilayer structure reduces the electrical impedance of the piezoelectric ceramic element, e.g., lead zirconate titanate (PZT).

In a multi-layer PZT transducer array, the N layers (N>1) are coupled acoustically in series, so that the $\lambda/2$ resonant thickness (where X is the ultrasound wave-length) is t, the stack thickness. When the polarity of an applied voltage matches the poling direction, the piezoelectric material expands in the thickness direction. Since the electrical polarity is the same as the poling direction for each layer, the layers expand or compress together. For a given applied voltage, the electric field across each layer (thickness t/N) is greater than that for a single-layer transducer (thickness t), resulting in larger acoustic output energy. Electrically, the layers are connected in parallel. Compared to a single-layer device, an N-layer device is essentially the sum of N thinner capacitors in parallel. Since the overall thickness of the structure remains constant for a given frequency of operation, the capacitance of the device increases as a function of $N^2$. Correspondingly, the electrical impedance drops as a function of the inverse of $N^2$.

Since conventional (single-layer) transducer elements tend to have a high electrical impedance compared to that of the cable connecting the element to the console, these conventional transducer elements experience a serious impedance mismatch which limits transfer of electrical power between the element and the console electronics. While this mismatch is undesirable for conventional one-dimensional transducers for which the element impedance is typically several hundred ohms compared to 50 ohms for the cable, it is intolerable for multi-row probes where the element impedance is typically a few thousand ohms. A piezoelectric structure having even a few layers is enough to reduce the mismatch and thereby improve the sensitivity to a tolerable level.

In an ideal piezoelectric element, the electric field is uniform and homogeneous throughout the piezoelectric material. In contrast, for piezoelectric elements having wraparound electrodes, the electric field near the wraparound electrode is distorted. Thus, when a voltage is applied, the resulting electric field produces undesirable stresses in the element. These stresses reduce the desired motion. In particular, the electromechanical efficiency is reduced compared to a parallel plate geometry.

In the past, others have recognized this problem in different contexts and have worked to eliminate it [see, e.g., U.S. Pat. No. 4,217,684] or exploit it to improve contrast resolution in an ultrasound imager [see, e.g., U.S. Pat. No. 4,460,841]. Piezoelectric ceramic has a remarkably high dielectric constant relative to air or most other materials, typically several hundred times greater for the hard PZT's to several thousand times greater for the soft PZTs. Desilets et al. ["Effect of Wraparound Electrodes on Ultrasonic Array Performance," 1998 IEEE Ultrasonics Symposium] teaches use of a saw kerf (i.e., dicing slot) to change the dielectric constant near the edges of the piezoelectric ceramic layer. This dramatically reduces the fringe electric field with its associated capacitance and also minimizes stresses caused by horizontal components of the electric field. Thus, dicing slots can be used to confine the electric field and create more uniform mechanical motion. However, the kerf cannot be arbitrarily narrow because it must be produced with a saw blade whose thickness is governed by the strength of the blade material. Similarly, the segment of ceramic supporting the wraparound electrodes must be substantial enough not to break. The kerf can be filled with epoxy, or another low dielectric constant material, and still achieve the desired effect. However, the low-dielectric-constant material is introduced after the ceramic structure (having a high dielectric constant) has been otherwise fabricated as a homogeneous body.

All piezoelectric transducers operate by applying a voltage to electrodes on opposite faces of the device. For a single-layer transducer, it is not necessary to have electrodes which wrap around the edge of the piezoelectric ceramic. In certain fabrication strategies it is convenient to have the electrodes available on the side of the elements or to be able to make electrical contact to both the top and bottom of the ceramic from just one of those surfaces.

However, when working with multilayer piezoelectric transducers, there must be a connection to the internal electrodes. This contact is usually provided by a wraparound electrode. Multilayer piezoelectric transducers are most useful for multirow arrays where the element impedance is high, typically over a kilo-ohm. However, a simple dicing cut (as taught by Desilets et al.) would sever the connection to the internal electrodes for these transducers.

Thus there is a need for a technique which would allow one to control the electric field in a multilayer piezoelectric transducer.

BRIEF SUMMARY OF THE INVENTION

An ultrasound transducer array is manufactured by a method that introduces low-delectric-constant material, to confine the electric field, during fabrication of a multilayer piezoelectric ceramic. In the prior art, air or other material with a low dielectric constant was introduced through the thickness of the ceramic after the ceramic had been formed as a homogeneous body. In accordance with the preferred embodiment, edge segments made of low-dielectric-constant material and extending in the thickness direction are formed at opposing ends of the multilayer piezoelectric ceramic structure. These edge segments serve to confine the electric field to keep it substantially uniform and homogeneous throughout the piezoelectric ceramic material.

The low-dielectric-constant material is introduced at the of the multilayer ceramic. Each edge segment made of low-dielectric-constant material is situated and configured to separate a distal edge of an internal electrode from an opposing inter-electrode connection on the side of the piezoelectric ceramic lamination. These low-dielectric-constant regions confine the electric field to the high-dielectric-constant material, where it remains directed vertically. Consequently, when a voltage is applied between the electrodes, the piezoelectrically induced strains are almost entirely vertical. Spurious modes are therefore substantially reduced.

In a preferred embodiment, the low-dielectric-constant edge segments are not strained by an applied voltage. Hence the mode of vibration of the element is modified compared to the parallel plate geometry. This may even result in an improved beam profile since the ultrasound will be apodized, as is well known in the art [see, e.g., U.S. Pat. No. 4,460,841]. A modest broadening of the central lobe of the beam is compensated by significant reductions in sidelobe levels.

DETAILED DESCRIPTION OF THE INVENTION

Figure 1:
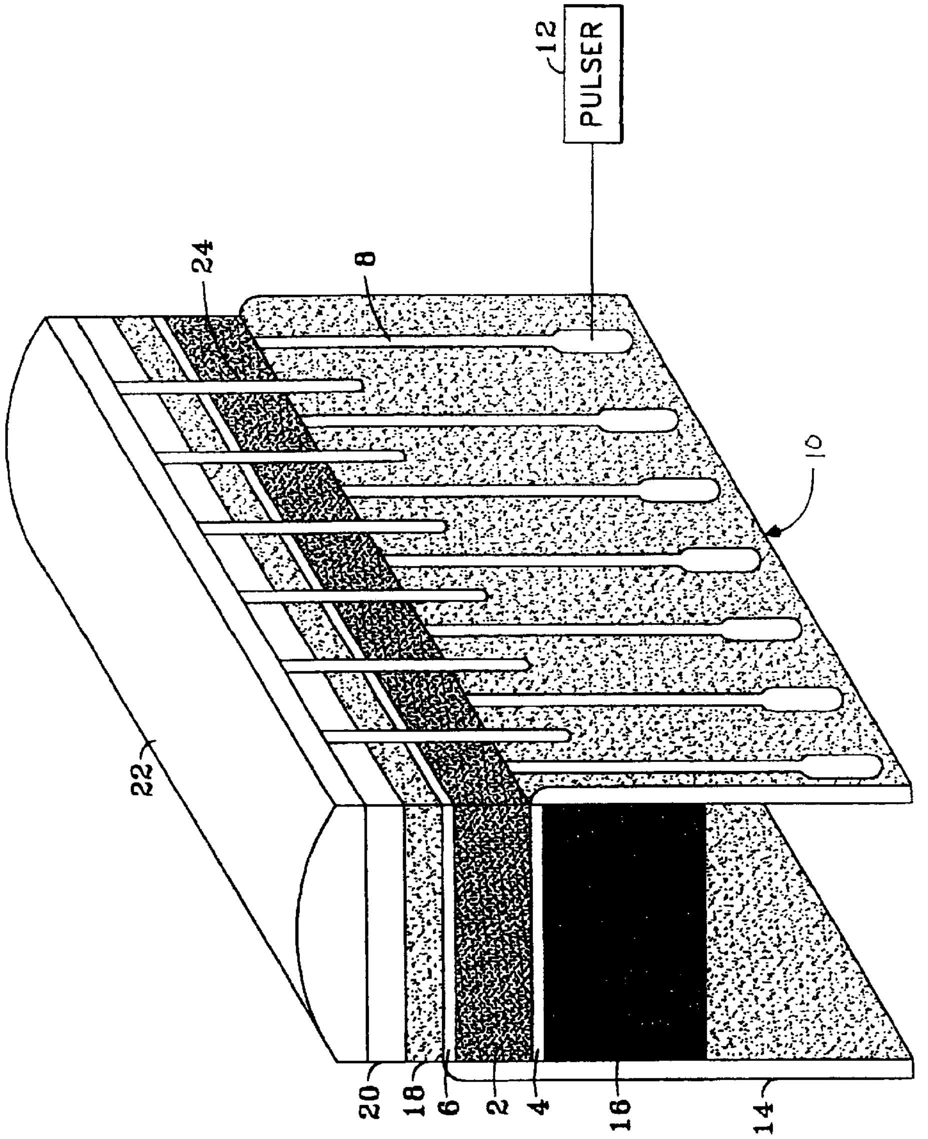
FIG. 1 is a schematic diagram showing an isometric view of a conventional single-PZT-layer transducer pallet.

A conventional ultrasonic probe comprises a transducer pallet which must be supported within a probe housing. As shown in FIG. 1, a conventional transducer pallet comprises a linear array of narrow transducer elements. Each transducer element comprises a layer 2 of piezoelectric ceramic material. The piezoelectric material is typically PZT.

Typically, piezoelectric ceramic material 2 of each transducer element has a signal electrode 4 formed on its rear face and a ground electrode 6 formed on its forward face. Each signal electrode 4 can be connected to a signal source, e.g., a respective pulser 12 in the transmitter (not shown) of the ultrasound imaging system, via a respective conductive trace 8 on a signal flexible printed circuit board (PCB) 10. Typically, each signal electrode is also typically selectively connectable to a respective receiver channel (not shown). The amplitude, timing and transmit sequence of the transmit pulses applied by the pulsers are determined by various control means incorporated in the system transmitter. Each ground electrode 6 is connected to a common ground (not shown) via a respective trace (not shown) on a ground flexible PCB 14. Preferably both flexible PCBs are on the same side of the pallet, but are shown in FIG. 1 on opposite sides of the pallet for simplicity of illustration only.

The transducer pallet also comprises a mass 16 of suitable acoustical damping material having high acoustic losses, e.g., metal-loaded epoxy, positioned at the back surface of the transducer element array as a backing layer. This backing layer 16 is coupled to the tear surface of the transducer elements to absorb ultrasonic waves that emerge from the back side of each element, so that they will not be partially reflected and interfere with the ultrasonic waves propagating in the forward direction.

Typically, each transducer array element also comprises a first acoustic impedance matching layer 18, which is bonded to the metallized forward face (which metallization forms ground electrode 6) of piezoelectric ceramic layer 2. A second acoustic impedance matching layer 20 is bonded to first acoustic impedance matching layer 18. Layers 2, 18 and 20 in the transducer pallet are bonded with acoustically transparent thin layers of adhesive. The acoustic impedance of second matching layer 20 must be less than the acoustic impedance of first matching layer 18 and greater than the acoustic impedance of the medium acoustically coupled to the transducer array.

The pallet shown in FIG. 1 has been diced into separate transducer elements, each element comprising layers 2, 4, 6, 18 and 20 laminated together to form a stack. It will be readily appreciated, however, that the undiced pallet is constructed by laminating sheets or plates of material to form a stack. The pallet is then diced to a sufficient depth to form the respective transducer elements. A dicing saw is used to form parallel element isolation cuts or kerfs 24. Each cut passes completely through acoustic matching layers 18 and 20 and piezoceramic layer 2, but extends only partially into acoustic absorbing layer 16. Kerfs 24 may be subsequently filled with elastomer or rubber material.

After dicing, the front faces of second acoustic impedance matching layers 20 of the transducer elements are conventionally bonded to the planar rear face of a convex cylindrical lens 22 using an acoustically transparent thin layer of silicone adhesive. Lens 22 serves three purposes: (1) acoustic focusing (due to its lens-shaped cross section and its low acoustic velocity material properties); (2) providing a chemical barrier to protect the transducer elements from attack by gels, body fluids, cleaning agents, etc.; and (3) providing an electrical barrier to protect the patient from the electrically active transducer elements. The lens is conventionally made of silicone rubber.

Figure 2:
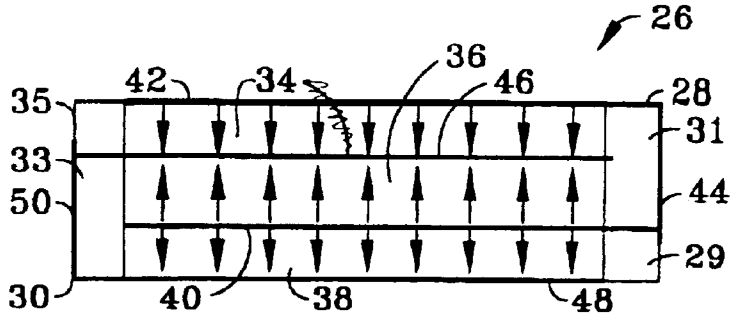
FIG. 2 is a schematic diagram of a multilayer PZT stack in accordance with a preferred embodiment of the invention, the electric field in the PZT material being indicated by arrows.

For an ultrasound transducer having a multilayer stack of piezoelectric material with internal electrodes sandwiched between adjacent layers, the piezoelectric stack is substituted for single layer 2 shown in FIG. 1. A multilayer PZT stack 26 with respective arrays of parallel electrodes 28, 30 and respective low-dielectric-constant edge segments 29, 31, 33 and 35, in accordance with a preferred embodiment of the invention, is depicted in FIG. 2. Assuming that the top face of multilayer stack 26 will be acoustically coupled to the first acoustic matching layer, while the bottom face will be acoustically coupled to the mass of acoustic absorbing material, electrode array 28 will be connected to ground, while electrode array 30 will be connected to the signal source. The stack 26 shown in FIG. 2 comprises three parallel sheets or plates of piezoelectric ceramic material 34, 36, and 38, respectively, each layer of ceramic material being constant in thickness. For a three-layer stack, electrode array 28 comprises an internal electrode 40 arranged between piezoelectric ceramic layers 36 and 38, an external electrode 42 arranged on the outer face of piezoelectric ceramic layer 34, and an inter-electrode connection 44 spanning the end faces on one side of layers 34, 36 and 38. Inter-electrode connection 44 electrically connects electrodes 40 and 42. Inter-electrode connection 44 also is preferably electrically connected to ground via a connection which includes a ground flexible PCB similar to ground flexible PCB 14 shown in FIG. 1. Electrode array 30 also comprises an internal electrode 46 arranged between piezoelectric ceramic layers 34 and 36, an external electrode 48 arranged on the outer face of piezoelectric ceramic layer 38, and an inter-electrode connection 50 spanning the end faces on the other side of layers 34, 36 and 38. Inter-electrode connection 50 electrically connects electrodes 46 and 48. In addition, inter-electrode connection 50 is preferably electrically connected to the signal source via a connection which includes a signal flexible PCB similar to flexible PCB 10 shown in FIG. 1.

In accordance with a preferred embodiment, stack 26 is fabricated with a first low-dielectric-constant edge segment 31 situated between the end of internal signal electrode 46 and ground inter-electrode connection 44. Preferably, edge segment 31 is in the shape of a parallelpiped having a height approximately equal to the sum of the thicknesses of ceramic layers 34 and 36 (neglecting the thickness of internal signal electrode 46) and a width equal to the distance separating the end of internal signal electrode 46 and ground inter-electrode connection 44. Similarly, a second low-dielectric-constant edge segment 33 is situated between the end of internal ground electrode 40 and signal inter-electrode connection 50. Edge segment 33 is in the shape of a parallelpiped having a height approximately equal to the sum of the thicknesses of ceramic layers 36 and 38 (neglecting the thickness of internal signal electrode 46) and a width equal to the distance separating the end of internal ground electrode 40 and signal inter-electrode connection 50. In addition, a third low-dielectric-constant edge segment 29 is situated below edge segment 31 adjacent layer 38, while a fourth low-dielectric-constant edge segment 35 is situated above edge segment 33 adjacent layer 34. The edge segments of low-dielectric-constant material confine the electric field to the high-dielectric-constant material, where it remains directed vertically, as depicted by arrows in FIG. 2. In this way, when a voltage is applied between the electrodes, the piezoelectrically induced strains are almost entirely vertical. Spurious modes are therefore substantially reduced.

Figure 3:
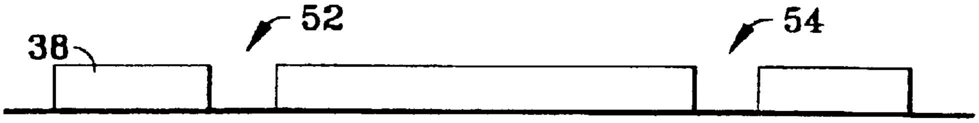
FIGS. 3–8 are schematic diagrams respectively depicting the steps in manufacturing a multilayer PZT stack in accordance with one preferred embodiment of the invention.
Figure 4:
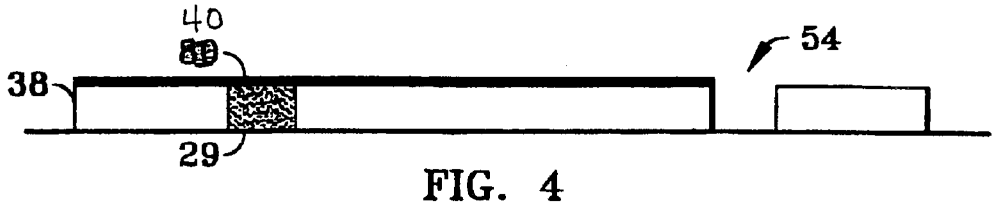
Figure 5:
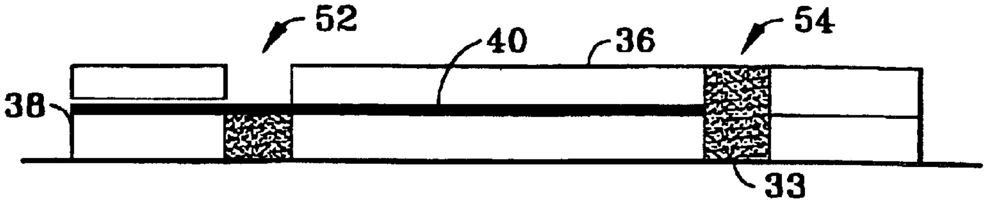
Figure 6:
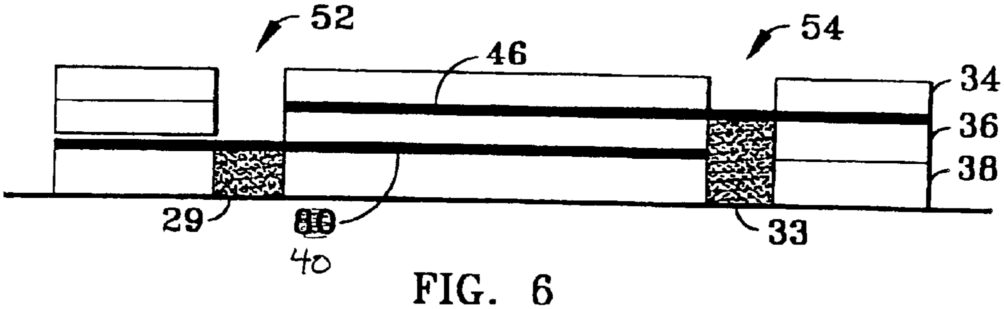
Figure 7:
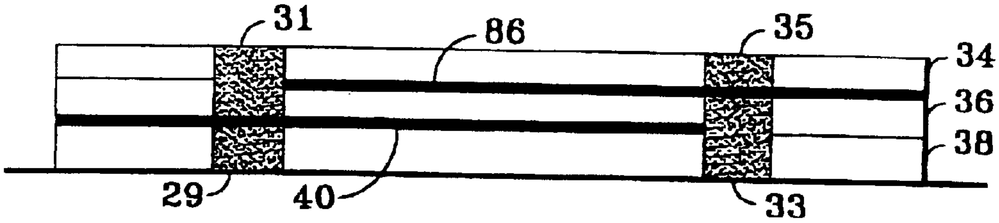
Figure 8:
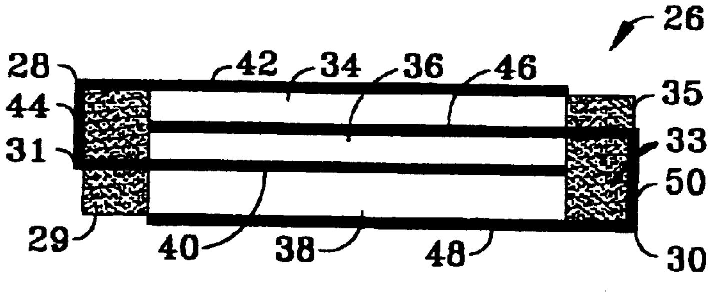

The steps of a method for manufacturing the multilayer piezoelectric stack depicted in FIG. 2 are illustrated in FIGS. 3–8. The manufacturing process is started, as shown in FIG. 3, by laying down a tape or strip of piezoelectric ceramic material 38 having vias or slits 52 and 54 therein. Via 52 in layer 38 is then filled with low-dielectric-constant material 29, as shown in FIG. 4. The portion of the top surface of piezoelectric ceramic material layer 38 to the left (in FIG. 3) of via 54 and the top surface of low-dielectric-constant material 29 is then coated with metal to form an electrode 40, as indicated in FIG. 4. A second layer 36 of piezoelectric ceramic material having vias 52 and 54 is then applied on top of first ceramic layer 38, vias 52 and 54 of layer 36 being respectively aligned with vias 52 and 54 of layer 38, as shown in FIG. 5. Thus, via 52 of layer 36 overlies the portion of electrode 40 which overlies low-dielectric-constant material 29. The opening formed by vias 54 in layers 36 and 38 is then filled with low-dielectric-constant material 33. As shown in FIG. 6, the portion of the top surface of piezoelectric ceramic material layer 36 to the right of via 52 and the top surface of low-dielectric-constant material 33 are then coated with metal to form an electrode 46. A third layer 34 of piezoelectric ceramic material having vias 52 and 54 is then applied on top of second ceramic layer 36, vias 52 and 54 of layer 34 again being respectively aligned with vias 52 and 54 of layers 36 and 38, as shown in FIG. 6. Thus, via 54 of layer 34 overlies the portion of electrode 46 which overlies low-dielectric-constant material 33. The opening formed by vias 52 in layers 34 and 36 is then filled with low-dielectric-constant material 31, as shown in FIG. 7. Also via 54 in layer 34 is filled with low-electric-constant material 35. The laminated stack shown in FIG. 7 is then sintered, in order for the sintered low-dielectric-constant material to form the edge segments 29, 31, 33 and 35. The ends of the sintered piezoelectric stack are then trimmed to expose the low-dielectric-constant material at both end faces, as shown in FIG. 8. Also the top and bottom external surfaces of the piezoelectric stack can be ground down to ensure that the exposed surfaces of thee edge segments are flush with the external surfaces of layers 34 and 38, respectively. Thereafter, the external electrodes and inter-electrode connections are applied by metallizing external surfaces of the multilayer piezoelectric stack. As shown in FIG. 8, external electrode 42 is applied on the exposed surface of third ceramic layer 34 and the exposed top surface of edge segment 31; inter-electrode connection 44 is applied on the exposed side surface of edge segment 31; external electrode 48 is applied on the exposed surface of first ceramic layer 38 and the exposed bottom surface of edge segment 33; and inter-electrode connection 50 is applied on the exposed side surface of edge segment 33. Inter-electrode connection 44 must be applied in a manner such that electrodes 40 and 42 are electrically connected. Similarly, inter-electrode connection 50 must be applied in a manner such that electrodes 46 and 48 are electrically connected.

The finished stack shown in FIG. 8 is ready to be incorporated in a transducer pallet. As part of the latter process, a mass of acoustic absorbing material will be adhered to the electrode-coated bottom surface of ceramic layer 38; an acoustic matching layer will be adhered to the electrode-coated top surface of ceramic layer 34; a signal flexible PCB will be connected to inter-electrode connection 50 or back surface electrode 48; and a ground flexible PCB will be connected to inter-electrode connection 44 or front surface electrode 42. The resulting slab of material is then diced in conventional fashion to produce the transducer array shown in FIG. 9.

Alternative methods of manufacture are possible. For example, the regions shown as vias in FIGS. 3–8 can be filled with a fugitive material when making the original tapes. Then when the part is fired during sintering, these fugitive regions are burned away, leaving holes which are then filled with epoxy or a similar low-dielectric-constant material. Entirely different approaches are also possible. For example, computer-controlled "printers" have been developed to arrange powders of several different materials in specific three-dimensional structures. Alternatively, stripes of low-dielectric-constant or fugitive material corresponding to the edge segments can be applied, followed by piezoelectric material cast around the stripes. Or, a layer of piezoelectric material can be cast and, while the casting is in its "green" (unsintered) state, photolithographically define and etch away vias 52 and 54, followed by filling the vias with low-dielectric-constant material.

Alternatively, it is possible to construct a multilayer transducer array using a method comprising the following steps: laminate "green" sheets of ceramic coated with polymer-ceramic ink for the electrode; dice or laser drill the stack to form slits or vias; sinter the resulting part; and then backfill the slits or vias. The external electrodes may be added after the sintering, or alternatively be co-sintered in place, depending on the electrode composition. Platinum and palladium are examples of metals able to withstand the sintering temperature.

Although the preferred embodiment has been disclosed with reference to an exemplary piezoelectric stack having three (N=3) layers, it should be understood that the invention has application in any multilayer piezoelectric stack regardless of the number of layers (i.e., N>1).

Several possible choices exist for a low-dielectric-constant material to be used in fabricating edge segments for confining the electric field. It is advantageous to select a material which can be co-fired with the piezoelectric ceramic, i.e., another compatible ceramic. Many conventional ceramics are used in other electronic applications, such as alumina, $Al_2O_3$. Alumina has a relative dielectric constant of about 10 at frequencies in the low MHz range used for ultrasound imaging. Compared to some piezoelectric ceramics with relative dielectric constants in excess of 1,000, the field lines will be confined or straightened by over a factor of 100 compared to what would occur in the homogeneous piezoelectric material.

The choice of a particular material can be made with regard not only to the dielectric constant, but also processing characteristics. The high dielectric constant of piezoelectric ceramics occurs because the composition is near a morphotropic phase boundary. Many of the constituent materials have distinctly lower dielectric constants. Therefore one might expect to use one of the constituent materials for the low-dielectric-constant regions. However, in the common instance of PZT, the constituent oxides, lead oxide, zirconium oxide and titanium oxide, cannot be sintered under the same conditions as PZT. For example, lead oxide will diffuse or be volatilized and will mix with the rest of the sample. The regions that were originally pure lead oxide will become less dense and more brittle and will probably crack during processing. Also alumina tends to react with lead to form weaker components.

Other, better compositions which could be used for the low-dielectric-constant regions exist. These better compositions are characterized by their low dielectric constant and high sinterability, e.g., magnesium titanate, calcium titanate, strontium titanate, yttrium-stabilized zirconium oxide, and bismuth titanate. Adding a small quantity of lead to these materials may promote co-sintering. In addition, zirconates and stannates of lead and alkaline earth and rare earth oxides and titanium dioxide are other materials which should be co-sinterable with PZT. Additionally, these long dielectric constant materials can be mixed with selected glass frits to promote co-sintering with the PZT layers.

Figure 9:
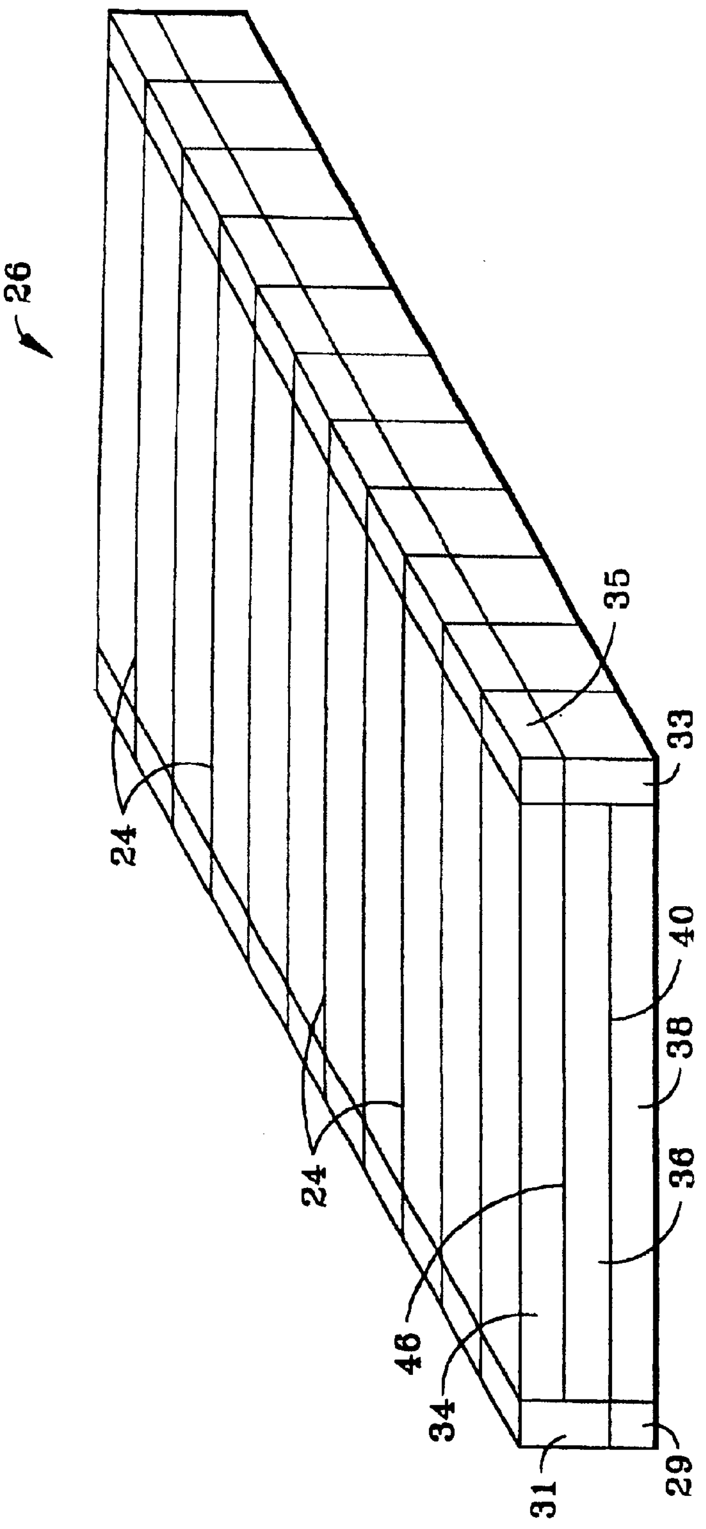
FIG. 9 is an isometric view of a transducer array in accordance with preferred embodiments of the invention.
Figure 10:
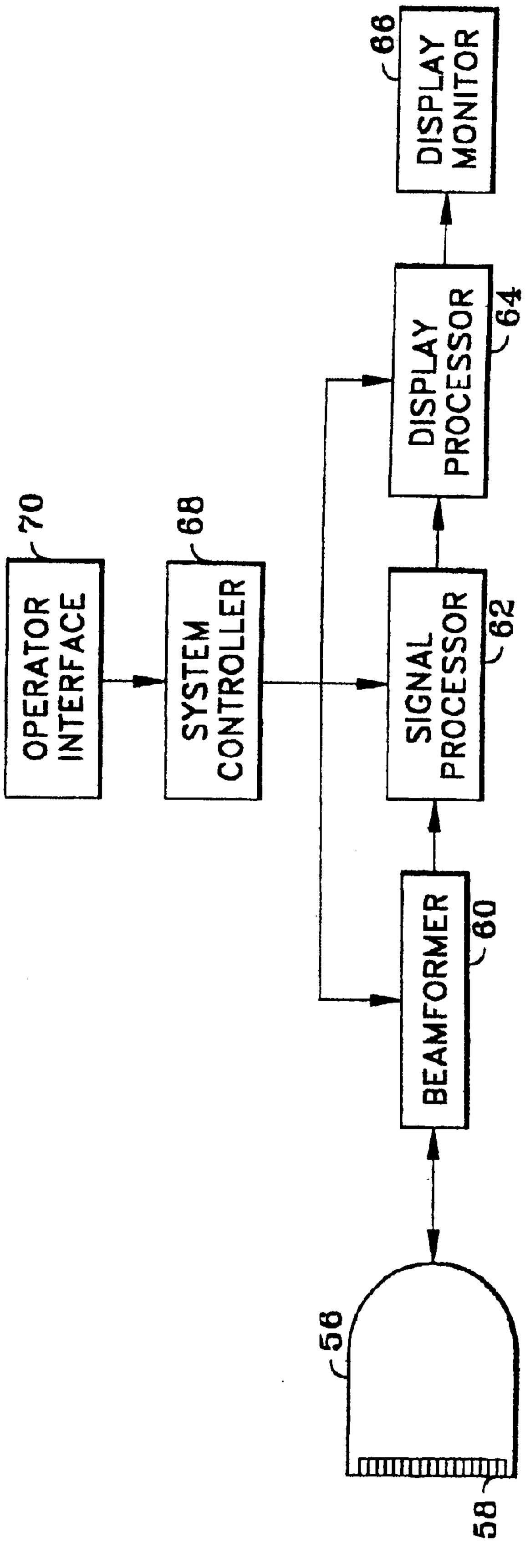
FIG. 10 is a block diagram generally depicting a real-time digital ultrasound imaging system in which a multilayer PZT transducer in accordance with the preferred embodiments can be incorporated.

The ultrasound transducer probe of the invention can be incorporated in an otherwise conventional ultrasound imaging system. The basic signal processing chain in a B-mode imaging system incorporating the invention is depicted in FIG. 10, where ultrasound probe 56 includes a transducer array 58 comprising a multiplicity of transducer elements, each element comprising a multilayer piezoelectric ceramic stack such as depicted in FIG. 9. The individual elements of the transducer array are activated by respective pulsers incorporated in a transmitter portion of a beamformer 60. The pulsers are controlled to cause the transducer array to transmit an ultrasound beam focused at a transmit focal position. The return ultrasound wave energy is transduced to electrical RF signals by the transducer elements. These electrical signals are received in respective channels of a receiver portion of beamformer 60. The receiver portion of beamformer 60 dynamically focuses the receive signals at successive ranges along a scan line in a well-known manner to form a receive vector. The beamformer output data (I/Q or radio frequency) for each scan line is passed to a signal processor 62 for envelope detection and logarithmic compression. The resulting image data are then processed by a display processor 64 for display on a display monitor 66. System control is centered in a host computer or system controller 68, which accepts operator input commands through an operator interface 70 and in turn controls the various subsystems.

While only certain preferred features of the invention have been illustrated and described, many modifications and changes will occur to those skilled in the art. Moreover, the invention has application in any field where ultrasound transducers having enhanced sensitivity are needed, for example, in nondestructive testing. It is, therefore, to be understood that the appended claims are intended to cover all such modifications and changes as fall within the true spirit of the invention.

What is claimed is:

1. An ultrasound transducer array comprising a plurality of elements, each of said elements comprising:

a plurality of ultrasound transducer elements, each of said ultrasound transducer elements comprising:

first and second layers of piezoelectric ceramic material having a relatively high dielectric constant, each of said first and second layers having front and rear faces, said front face of said second layer facing said rear face of said first layer;

a first electrode in contact with said front face of said first layer;

a second electrode between said front face of said second layer and said rear face of said first layer;

a third electrode in contact with said rear face of said second layer;

a first inter-electrode connection electrically connecting said first and third electrodes; and a first segment of material having a relatively low dielectric constant, said first segment extending between said first inter-electrode connection and an opposing edge of said second electrode and between said first and third electrodes wherein a thickness of said first segment equals about a sum of at least a thickness of said first and second layers and said second electrode and wherein said first segment is situated and configured for confining an electric field to said material having a relatively high dielectric constant.

2. The ultrasound transducer array as recited in claim 1, wherein each of said ultrasound transducer elements further comprises:

a third layer of said piezoelectric ceramic material having front and rear faces, said front face of said third layer facing said rear face of said second layer with said third electrode therebetween;

a fourth electrode in contact with said rear face of said third layer;

a second inter-electrode connection electrically connecting said second and fourth electrodes; and a second segment of said material having a low dielectric constant, said second segment extending between said second inter-electrode connection and an opposing edge of said first electrode and between said second and fourth electrodes and wherein said second segment is situated and configured for confining an electric field to said material having a relatively high dielectric constant.

3. The ultrasound transducer array as recited in claim 1, wherein said piezoelectric ceramic material is sintered and said material having a low dielectric constant is sintered.

4. The ultrasound transducer array as recited in claim 3, wherein said piezoelectric ceramic material comprises lead zirconate titanate and said material having a low dielectric constant comprises one of the group consisting of alumina, lead stannate, titanium dioxide, magnesium titanate, calcium titanate, strontium titanate, yttrium-stabilized zirconium oxide, bismuth titanate, and equivalent materials.

5. The ultrasound transducer array as recited in claim 1, wherein each of said ultrasound transducer elements further comprises a layer of acoustic matching material having a surface which faces said front face of said first layer of said piezoelectric ceramic material, said first electrode being situated between said first layer and said layer of acoustic matching material.

6. The ultrasound transducer array as recited in claim 1, wherein said relatively high dielectric constant is greater than said relatively low dielectric constant by a factor of order 100.

7. The ultrasound transducer array as recited in claim 2, wherein the total number of layers of said piezoelectric ceramic material is greater than three.

8. An ultrasound transducer element comprising:

first and second layers of piezoelectric ceramic material having a relatively high dielectric constant, each of said first and second layers having front and rear faces, said front face of said second layer facing said rear face of said first layer;

a first electrode in contact with said front face of said first layer;

a second electrode between said front face of said second layer and said rear face of said first layer;

a third electrode in contact with said rear face of said second layer;

a first inter-electrode connection electrically connecting said first and third electrodes; and a first segment of material having a relatively low dielectric constant, said first segment extending between said first inter-electrode connection and an opposing edge of said second electrode and between said first and third electrodes wherein a thickness of said first segment equals about a sum of at least a thickness of said first and second layers and said second electrode and wherein said first segment is situated and configured for confining an electric field to said material having a relatively high dielectric constant.

9. The ultrasound transducer element as recited in claim 8, further comprising:

a third layer of said piezoelectric ceramic material having front and rear faces, said front face of said third layer facing said rear face of said second layer with said third electrode therebetween;

a fourth electrode in contact with said rear face of said third layer;

a second inter-electrode connection electrically connecting said second and fourth electrodes; and a second segment of said material having a low dielectric constant, said second segment extending between said second inter-electrode connection and an opposing edge of said first electrode and between said second and fourth electrodes and wherein said second segment is situated and configured for confining an electric field to said material having a relatively high dielectric constant.

10. The ultrasound transducer array as recited in claim 8, wherein said piezoelectric ceramic material is sintered and said material having a low dielectric constant is sintered.

11. The ultrasound transducer array as recited in claim 8, wherein said piezoelectric ceramic material comprises lead zirconate titanate and said material having a low dielectric constant comprises one of the group consisting of alumina, lead stannate, titanium dioxide, magnesium titanate, calcium titanate, strontium titanate, yttrium-stabilized zirconium oxide, bismuth titanate, and equivalent materials.

12. The ultrasound transducer array as recited in claim 8, wherein said relatively high dielectric constant is greater than said relatively low dielectric constant by a factor of order 100.

13. The ultrasound transducer array as recited in claim 9, wherein the total number of layers of said piezoelectric ceramic material in each element is greater than three.

* * * * *

UNITED STATES PATENT AND TRADEMARK OFFICE

CERTIFICATE OF CORRECTION

PATENT NO. : 6,822,374 B1
APPLICATION NO. : 09/712687
DATED : November 23, 2004
INVENTOR(S) : Lowell Scott Smith et al.

It is certified that error appears in the above-identified patent and that said Letters Patent is hereby corrected as shown below:

In the drawings, Sheet 2, Fig. 5, the reference numeral --29-- and a lead line should be directed to the first shaded block on the left.

In the drawings, Sheet 3, Fig. 7, the reference numeral “86” should be replaced with --46--.

In column 1, line 22, ““X” should be replaced by --λ--.

In column 3, line 59, “tear” should be replaced by --rear--.

In column 6, line 3, “thee” should be replaced by --the--.

Signed and Sealed this

Eleventh Day of August, 2009

David J. Kappos

David J. Kappos
*Director of the United States Patent and Trademark Office*